United States Patent [19]

Scheer et al.

[11] Patent Number: 5,257,947
[45] Date of Patent: Nov. 2, 1993

[54] ELECTRICAL CONNECTOR WITH IMPROVED HOLD-DOWN MECHANISM

[75] Inventors: Dennis K. Scheer, Willowbrook; Kent E. Regnier, Lombard, both of Ill.

[73] Assignee: Molex Incorporated, Lisle, Ill.

[21] Appl. No.: 989,614

[22] Filed: Dec. 14, 1992

[51] Int. Cl.5 .......................................... H01R 13/74
[52] U.S. Cl. ...................................... 439/567; 29/856
[58] Field of Search ............... 439/555, 557, 567, 571; 29/856; 264/299

[56] References Cited

U.S. PATENT DOCUMENTS 5,108,308  4/1992  Northcraft et al. ................ 439/555

FOREIGN PATENT DOCUMENTS 4034690A  11/1991  Fed. Rep. of Germany .
0789746   1/1958   United Kingdom ............... 439/557
2239135A  6/1991   United Kingdom .

Primary Examiner—Eugene F. Desmond
Attorney, Agent, or Firm—Charles S. Cohen; Stacey E. Caldwell

[57] ABSTRACT

A surface mounted electrical connector assembly includes a dielectric housing having a mounting peg projecting outwardly from one surface of the housing for insertion into a hole in a printed circuit board. The mounting peg is split to define a slot extending through a distal end of the peg. A bifurcated metal retainer member having barbs thereon is disposed in the slot and projects transversely outwardly therefrom for biasingly engaging the board. Inwardly projecting ribs are provided on the peg, within the slot, with the ribs being engageable with the metal retainer member when the peg is inserted into the hole in the printed circuit board. The ribs are spaced axially from a distal end of the retainer member whereby the retainer member is maintained spaced from the peg within the slot in a zone between the rib means and the distal end of the peg. By selecting the point at which the rib means engage the metal retainer member, a method is provided for optimizing the relative insertion and retention forces between the connector assembly and the printed circuit board and for accommodating different insertion and retention force requirements.

8 Claims, 3 Drawing Sheets

ELECTRICAL CONNECTOR WITH IMPROVED HOLD-DOWN MECHANISM

FIELD OF THE INVENTION

This invention generally relates to the art of electrical connectors and, particularly, to an electrical connector assembly having an improved hold-down mechanism for mounting and retaining the connector assembly to a printed circuit board, panel or the like.

BACKGROUND OF THE INVENTION

Printed circuit board connectors, such as elongated edge card connectors or SIMM sockets, typically use hold-down mechanisms such as mounting pegs or boardlocks to locate and retain the connector to the printed circuit board prior to or during processing. If the connector is not properly located and held to the board during handling and processing, the connector itself may become separated and damaged, or the fragile unsoldered leads may be damaged or incorrectly positioned. Furthermore, in surface mount applications, the surface mount leads can "float" off of the surface of the printed circuit board or miss the solder pads on the board entirely, resulting in open circuit conditions. Location and retention of the connector is particularly critical in applications where double-sided circuit boards are utilized and where the mounting pegs or boardlocks cannot protrude through the board where they may interfere with connectors or other circuit components.

Problems have been encountered in designing hold-down mechanisms with an optimization of the relative insertion forces and retention forces between the connector assembly and the printed circuit board. In other words, in designing mechanisms that provide adequate retention forces to hold the connector assembly to the printed circuit board, the insertion forces of the mechanism often are excessive. On the other hand, if the hold-down mechanism is designed with sufficient flexibility and resilience to lower the insertion forces, typically the retention forces of the mechanism are inadequate or at least compromised.

Furthermore, each connector user may have a different force requirement for a given connector configuration. That is, depending on the connector user's process for assembling or processing the connector, the insertion and retention force requirements may vary. For example, if a connector user is manually placing his connectors on a printed circuit board, he may want a low insertion force mounting peg design. He may have other requirements if the connector is being robotically placed or handled. If a second user has a secondary operation in his process that requires handling or shipment of a printed circuit board subsequent to mounting a connector, but prior to soldering it, a high retention force mounting peg may be required. Another user may require a lower retention force mounting peg where a higher retention force may place too much stress on the thinner substrate. Still further, in high density applications where terminals may be fragile, and in particular in surface mount applications, higher retention force mounting pegs may relieve solder joint stress and improve coplanarity of surface mount leads.

Heretofore, when a connector user's mounting peg insertion or retention force requirements varied, a new peg design was required, for example by increasing the diameter or the press-fit dimension of the peg with respect to a printed circuit board aperture. In a given connector, therefore, mold changeovers and design changes would be both expensive and laborious.

Therefore, there exists a need for an improved mounting peg construction which provides not only for optimization between low insertion forces and high retention forces in both through-hole and surface-mount applications, but for a peg construction which accommodates changing force requirements of a given connector in different applications. This invention is directed to satisfying that need and simplifying the previously laborious and expensive process of tool changeover due to the changing insertion and retention force requirements of a connector user by providing an improved hold-down mechanism construction and method for molding the hold-down mechanism.

SUMMARY OF THE INVENTION

An object, therefore, of the invention is to provide an electrical connector assembly having an improved hold-down mechanism. Another object of the invention is to provide a simple and inexpensive method for adjusting the relative insertion and retention forces between a given electrical connector assembly and a printed circuit board.

The connector assembly includes a dielectric housing having a compressible mounting peg projecting outwardly from one surface of the housing for insertion into and engagement along opposite diametral sides of a hole in a printed circuit board. In the exemplary embodiment of the invention, the mounting peg is split to define a slot extending through a distal end of the peg. The mounting peg is hollow and the slot extends entirely through the radial dimensions of the peg to define two pairs of opposing surfaces. The invention contemplates the provision of inwardly projecting protrusions on each of the pair of opposing surfaces engageable with opposing projecting protrusions when the peg is inserted into the hole in the printed circuit board. The protrusions are spaced axially from a distal end of the peg to define the compressibility of the plug. The invention contemplates that the point at which the protrusions are spaced axially from the distal end of the peg be selected to thereby selectively vary the compressibility of the peg and, therefore, to select the relative insertion and retention forces between the connector assembly and the printed circuit board.

In a second embodiment of the invention, a bifurcated metal retainer member is disposed within the slot and projects transversely outwardly therefrom. The inwardly projecting protrusions engage the metal retainer when the peg is inserted into the hole of the printed circuit board. This embodiment allows for added retention of the peg along a second generally perpendicular axis and is especially practical in surface mount applications where components are located on both surfaces of a printed circuit board and where it is desirable to configure the mounting peg, and metal retainer, to lie substantially within the plane of the printed circuit board.

The second aspect of the invention involves the process for molding the peg configuration described above. The housing of the connector assembly is molded in a conventional ejection mold, known in the art, and is provided with inserts and cores which define and determine the actual structure of the housing. The peg is integrally molded with the housing, and the projecting protrusions are integrally formed by selecting one of a plurality of inserts which define the spacing of the protrusion from the distal end of the peg, i.e. the length or amount of projecting protrusion formed on the peg surface. By merely exchanging one insert for another of a different length, the projecting protrusion will correspondingly have a different length and the relative insertion and retention forces of the peg can be varied.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
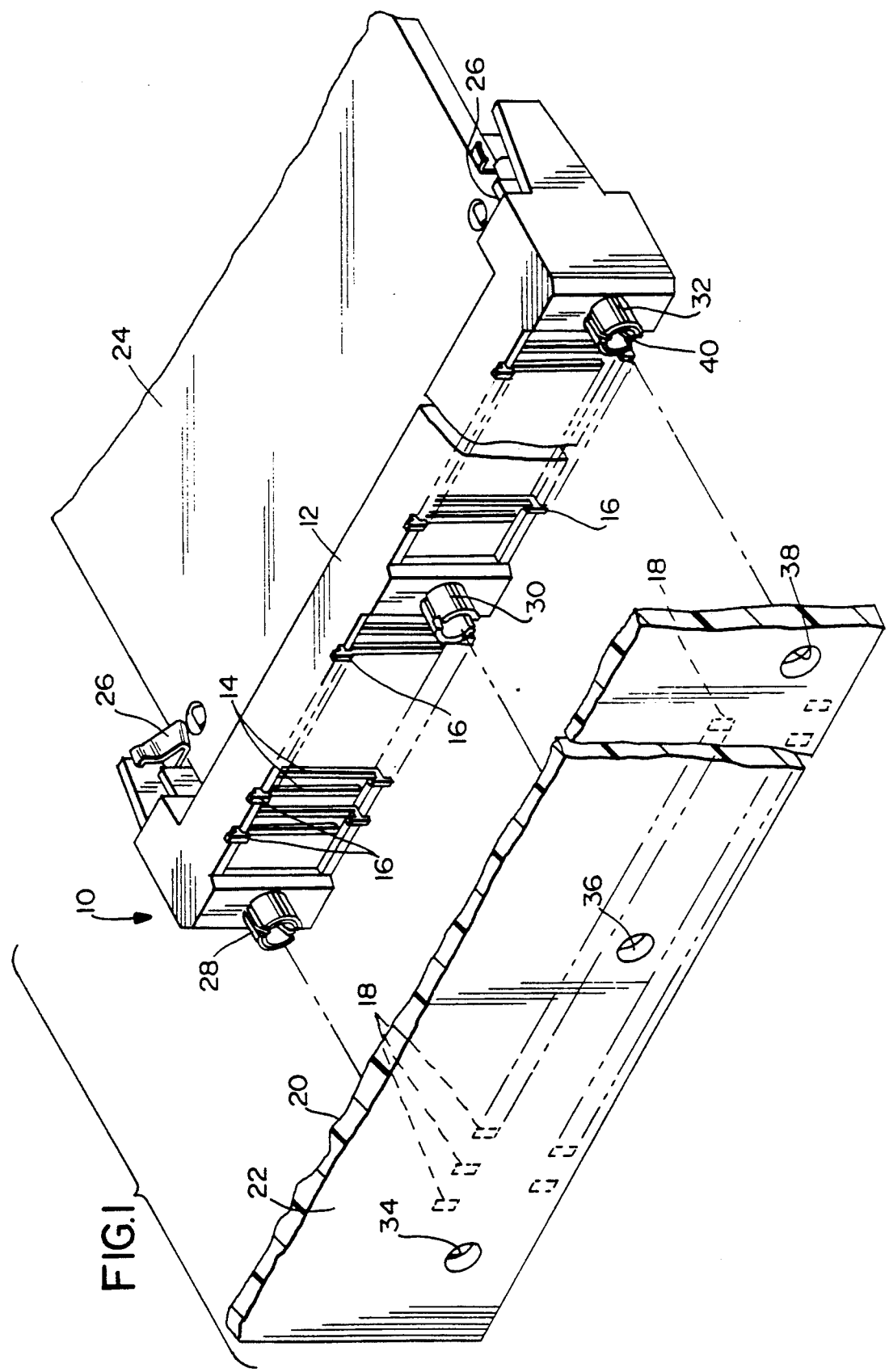
FIG. 1 is a perspective view of an electrical connector incorporating the hold-down mechanism of the subject invention in conjunction with a pair of printed circuit boards to be interconnected by the connector.
Figure 2:
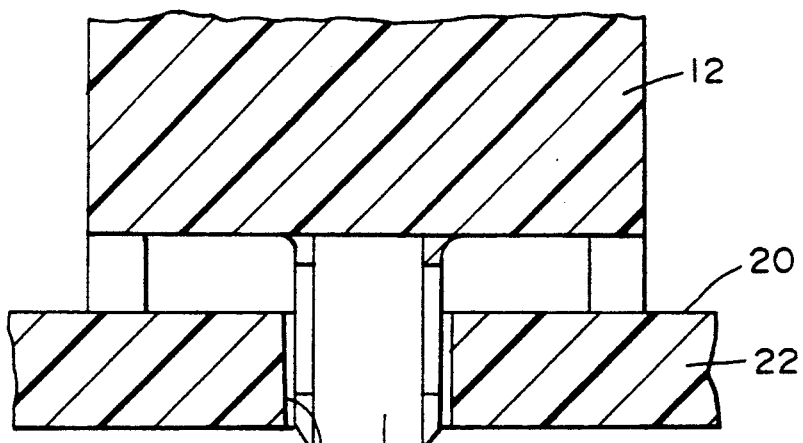
FIG. 2 is a section through one of the printed circuit boards, with the connector mounted thereto, and with a first embodiment of the hold-down mechanism of the invention inserted into a hole in the printed circuit board.

Referring to the drawings in greater detail, and first to FIG. 1, the invention is embodied in an improved electrical connector assembly, generally designated 10, which includes a dielectric housing 12 having a plurality of through passages 14 for mounting a plurality of terminals which include contact portions 16. In the embodiment shown, the feet of the terminals are solderable to contact pads 18 on one side 20 of a printed circuit board 22.

Generally, the electrical connector assembly is shown as an elongated edge card connector, such as a "SIMM socket", for receiving the edge of a second printed circuit board 24 and interconnecting circuit traces on the second board to the terminals of the connector assembly. The second printed circuit board is held to the connector assembly by a pair of metal latches 26. However, it should be understood that the improved mounting peg construction described herein is equally applicable to numerous other types or designs of electrical connector assemblies.

Connector 10 is shown to include three mounting pegs 28, 30 and 32 for insertion, respectively, into holes 34, 36 and 38 of printed circuit board 22. Mounting peg 30 is the split peg of a first embodiment of the invention, and mounting pegs 28 and 32 are split pegs which include the metal retainer of a second embodiment disposed therewithin. It should be understood that the inventive concepts of the mounting pegs could be incorporated in either one or all of the mounting pegs or at any location on dielectric housing 12. The split pegs 28 and 32 are shown at the ends of the housing because the metal retainer member 40 can be formed integrally with the metal latches 26 at the ends of the connector assembly.

As stated in the "Background", above, a dilemma constantly is encountered in designing mounting pegs for a given electrical connector configuration in accommodating different insertion and retention force requirements with respect to the printed circuit board. These requirements are determined by individual processing and handling procedures and must be met by balancing the sometimes conflicting requirements for maximum retention force with minimum insertion force. In some applications, flexibility and resilience of the mounting peg is necessary to reduce the insertion force, however, in others, the retention capabilities of the peg may not be compromised for any reason. This invention is directed to the structure of split mounting pegs 28, 30 and 32 and the metal retainer member 40 disposed within pegs 28 and 32, along with a novel method of adjusting the relative insertion and retention forces of a given connector/mounting peg configuration, such as connector 10, to printed circuit board 22.

More particularly, referring to FIGS. 2-5 in conjunction with FIG. 1, the mounting peg is identified in those figures by the general reference numeral 30. The peg is split to define a slot 42 extending through a distal end 44 of the peg.

Figure 3:
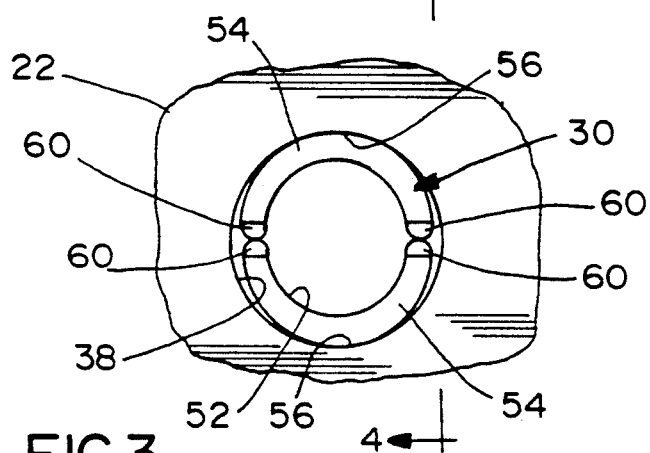
FIG. 3 is a bottom plan view of the hold-down mechanism of FIG. 2 in the hole of the printed circuit board.

As best seen in FIG. 3, peg 30 is hollow, as at 52, as defined by a pair of arcuate side portions 54 integrally molded with dielectric housing 12 of connector 10. The radial dimensions of the split peg are smaller than the diameter of hole 38 in printed circuit board 22 along the slot axis, but larger along the axis perpendicular to the slot, thereby engaging the hole at opposite diametral sides 56 thereof. Therefore, a generally two-point engagement is effected by the split peg at points 56.

Figure 5:
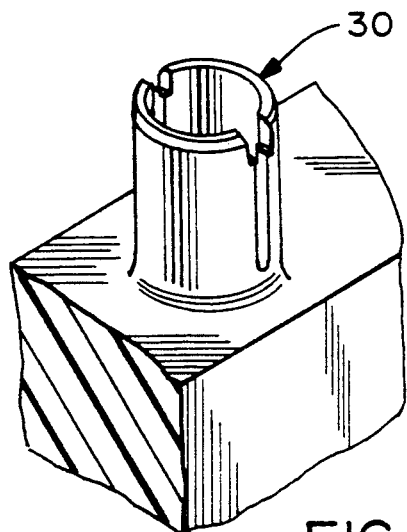
FIG. 5 is a perspective view of the first embodiment of the hold-down mechanism of the invention.

Generally, the invention contemplates that split peg 30 include inwardly projecting protrusions within slot 42 for engagement with oppositely directed integrally projecting protrusions when the peg is inserted into hole 38 in printed circuit board 22. Specifically, as best seen in FIGS. 3 and 5, an integrally molded rib 60 projects inwardly from opposing surfaces of arcuate side portions 54 of the split peg and into engagement with an opposing inwardly projecting rib. The rib extends from a first point proximate the housing to a second point toward, but short of, the distal end of the peg. In effect, the ribs resist one another as the peg is inserted into the printed circuit board hole 38. The amount of resistance is determined by the location of the second point which controls the compressibility and flexibility of side portions 54 of the peg. By selecting the distance the ribs extend, and thus the amount of resistance exerted, different fulcrum points can be defined to vary the extending free lengths of the peg, i.e. the moment arm of the peg, and to control the compressibility and resultant relative insertion and retention forces of the peg with respect to the printed circuit board.

Figure 4:
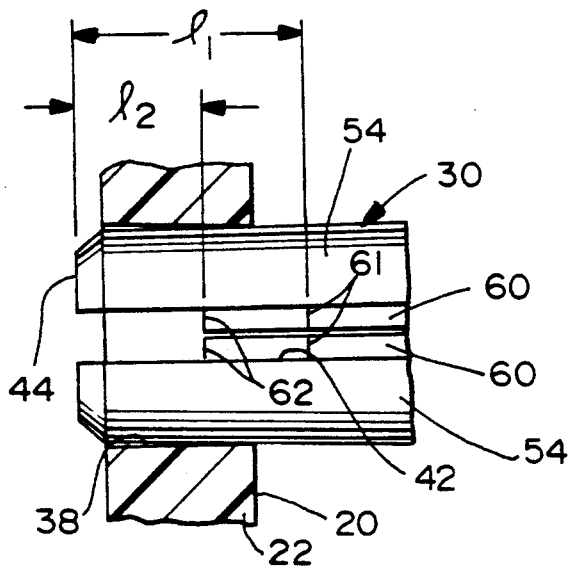
FIG. 4 is a section taken generally along line 4—4 of FIG. 3.

More particularly, referring to FIG. 4, two different length ribs, identified by lines 61 and 62, are shown to represent different lengths l(1) and l(2), respectively, of the ends of the ribs with respect to the distal end 44 of peg 30. If the ribs extend to point 61, i.e. spaced a distance l(1) from the distal end of the peg, the moment arms of the peg portions are longer and consequently more resilient and compressible than if the ribs extend to point 62 resulting in a spacing l(2) from the distal end of the peg. Therefore, a determination can be made of the desired relative insertion and retention forces between electrical connector 10 and printed circuit board 22, and the point to which ribs 60 extend toward the distal end of the peg 44 can be selected to accordingly vary the resiliency of the legs and the effective retention and insertion forces thereof until the desired forces are achieved. The end result is that an optimization of the relative insertion and retention forces between the connector assembly and the printed circuit board can be achieved, and be customized, as desired, or fine-tuned, to various end-user force requirements, without changing the overall configuration of the peg.

Figure 6:
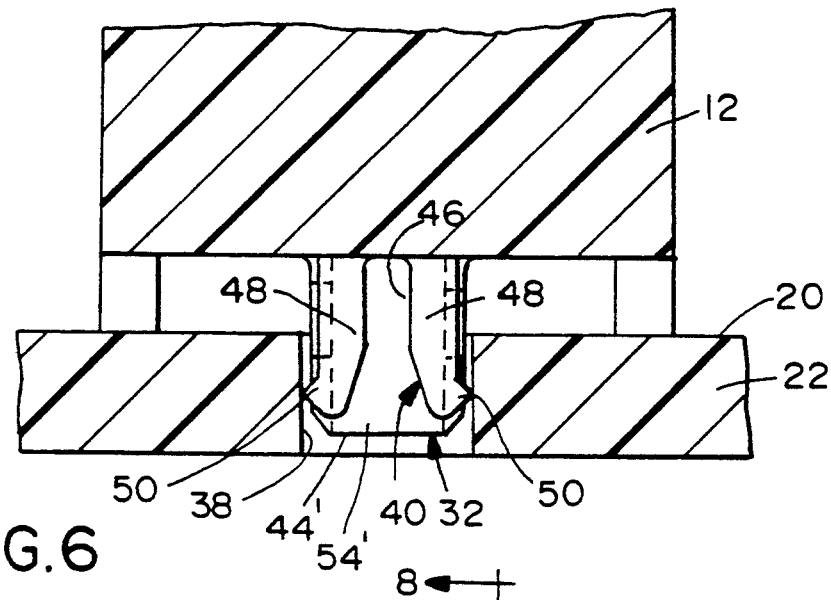
FIG. 6 is a section through one of the printed circuit boards, with the connector mounted thereto, and a second embodiment of the hold-down mechanism of the invention inserted into a hole in the printed circuit board.
Figure 7:
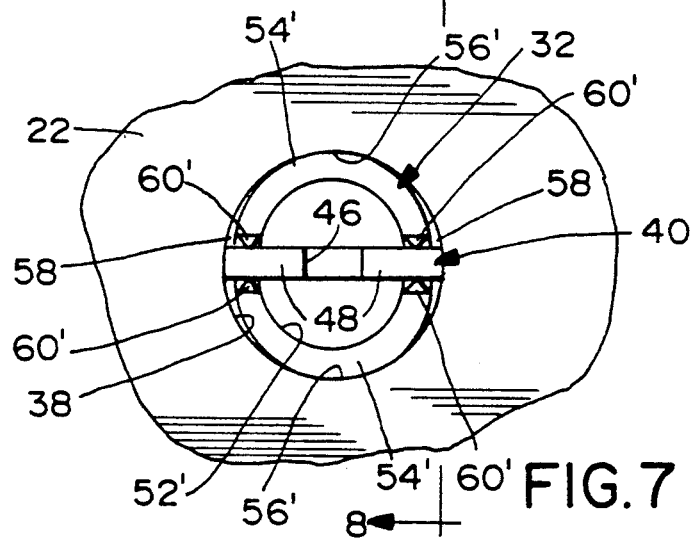
FIG. 7 is a bottom plan view of the hold-down mechanism of FIG. 6 in the hole of the printed circuit board.
Figure 8:
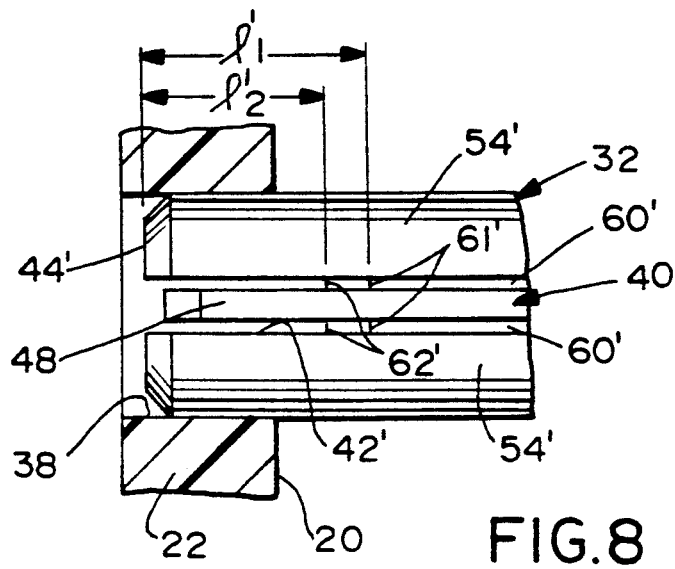
FIG. 8 is a section taken generally along line 8—8 of FIG. 7.

Referring now to FIGS. 6–8 in conjunction with FIG. 1, a second embodiment of the mounting peg is identified by the general reference numeral 32. Similar to peg 30 described above, peg 32 is split to define a slot 42' extending through a distal end 44' of the peg and has a metal retainer member 40 disposed therewithin. Peg 32 and metal retainer member 40 have lengths relative to the thickness of printed circuit board 22, such that the peg and retainer member are located within the bounds of hole 38 in the board. In other words, the peg and the metal retainer member do not project through the board where they may interfere with other connectors or other components mounted to the opposite side of the board.

As best seen in FIG. 8, metal retainer member 40 is bifurcated as at 46 in FIG. 6, to define a pair of legs 48 having barbs 50 projecting transversely outwardly from the peg and engageable with the inside surface of hole 38 in the printed circuit board.

As shown in FIG. 7, peg 32 is hollow, as at 52', as defined by a pair of arcuate side portions 54' integrally molded with dielectric housing 12 of connector 10. The radial dimensions of the split peg are smaller than the diameter of hole 38 in printed circuit board 22 along the slot axis, but larger than the diameter of the hole 38 along the axis perpendicular to the slot, whereby when metal retainer member 40 is disposed within slot 42' of split peg 32 (FIG. 8), the peg engages the hole at opposite diametral sides 56' thereof, and the retainer member is spaced from the sides of the hole 90° therefrom, as at 58. Therefore, a generally four-point engagement is effected by the split peg at points 56' and by the barbs 50 of metal retainer member 40. That is, retention force is exerted within the plane of the board along two perpendicular axes. This configuration is especially adapted for increased retention of a connector to a double-sided, surface-mount printed circuit board.

Similar to peg 30, the second embodiment contemplates that split peg 32 include inwardly projecting ribs 60' within slot 42' for engagement with legs 48 of metal retainer member 40 when the peg is inserted into hole 38 in printed circuit board 22. Specifically, as best seen in FIG. 7, a rib 60' projects inwardly from each edge of each arcuate side portion 54' of the split peg and into engagement with opposite sides of legs 48 of the metal retainer member. In essence, the two pairs of ribs provide opposing forces on opposite surfaces of the legs of the retainer member, as side portions 54' of the peg are biased against the inside surface of hole 38 at points 56'. These opposing forces control the compressibility and flexibility of the side portions of the peg in substantially the same manner as the opposing protrusions of peg 30. That is, by selecting the distance the ribs extend, different fulcrum points can be selected to vary the extending free lengths of the peg, i.e. the moment arm of the peg, to control the compressibility and resultant relative insertion and retention forces of the peg and the connector with respect to the printed circuit board. For example, referring to FIG. 8, two different length ribs, identified by lines 61' and 62' are shown to represent different lengths l(1)' and l(2)', respectively, of the ends of the ribs with respect to the distal end 44' of the peg 32. If the ribs extend to point 61', i.e. spaced a distance l(1)' from the distal end of peg 32, the moment arms of the peg portions are longer and consequently are more resilient and compressible than if the ribs engage the legs 48 at point 62' resulting in a spacing l(2)' from the distal end 44' of peg 32.

Turning now to the molding process, connector housing 12 described above is molded in a conventional ejection mold, known in the art, and is provided with inserts and cores which define and determine the actual structure of the housing. The slotted pegs, 28, 30 and 32, projecting from the bottom surface of the housing are integrally formed on the housing, and the projecting protrusions or ribs 60, are integrally formed on each of the peg surfaces that define the slot. The integrally molded projecting protrusions extend from a first point proximate the bottom surface of the housing to a second point toward, but short of, the distal end of the peg, and are formed by selecting one of a plurality of inserts which define the location of the second point, i.e. the length or amount of projecting protrusion which is formed on each peg surface. By merely exchanging one slot insert for another of a different length, the projecting protrusion will correspondingly have a different length and the relative insertion and retention forces of the peg can be varied.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. In an improved connector hold-down mechanism for retaining a connector assembly to a printed circuit board, the connector assembly including:
    a dielectric housing having terminals mounted therein; and
    a split compressible peg projecting from a bottom surface of the housing adapted to be inserted and retained in a hole in the printed circuit board and having two portions separated by a vertical slot, the slot defined by elongated, spaced-apart, generally parallel opposed surfaces;
the improvement in the compressible peg comprising:
    inwardly projecting protrusions integrally formed on the parallel opposed surfaces extending from a first point proximate the housing to a second point proximate, and spaced axially from, the distal end of the peg, said protrusions adapted to engage means for limiting the narrowing of the slot upon insertion of the peg into the hole of the printed circuit board, whereby the second point of the protrusion may be varied to change the compressibility of the peg and the relative insertion and retention forces with respect to the printed circuit board.

2. The improved connector hold-down mechanism as claimed in claim 1 wherein the means for limiting the narrowing of the slot comprises a metal retainer member disposed within the slot of the compressible peg, whereby the inwardly projecting protrusions of the compressible peg engage a portion of the metal retainer member upon insertion of the peg into the hole of the printed circuit board.

3. The improved connector hold-down mechanism as claimed in claim 2 wherein the compressible peg and metal retainer member are disposed substantially entirely within the plane of the printed circuit board.

4. The improved connector hold-down mechanism as claimed in claim 3 wherein the compressible peg and metal retainer member engage the sides of the printed circuit board hole along two perpendicular axes.

5. The improved connector hold-down mechanism as claimed in claim 2 wherein the metal retainer member is integrally connected to a metal latch member, said metal latch member being adapted to hold traces of a second printed circuit board in contact with the terminals mounted in the housing.

6. A method of adjusting, within a given mold, the relative insertion and retention forces of a connector assembly to a printed circuit board, the connector assembly including
a dielectric housing with terminals mounted therein, said housing having
a compressible split peg projecting from a bottom surface thereof adapted to be inserted and retained in a hole of the printed circuit board and having a vertical slot defined between elongated, spaced-apart, generally parallel opposed surfaces, and inwardly projecting protrusions formed on the parallel opposed surfaces extending from a first point proximate the housing to a second point proximate, and spaced axially from, a distal end of the peg, adapted to engage means for limiting the narrowing of the slot upon insertion of the peg into the hole;

the mold including
a plurality of interchangeable inserts having differing lengths positionable within said mold to define the second point to which the inwardly projecting protrusions extend;

the method comprising the steps of:
determining the requisite relative insertion and retention forces of said electrical connector assembly with respect to the substrate;

choosing an insert from the plurality of inserts which most closely corresponds to the determined requisite relative insertion and retention forces;

placing the insert in the mold to selectively produce the protrusion which achieves the requisite relative insertion and retention forces of the connector assembly to the printed circuit board.

7. The method of claim 6 further including the step of:

disposing a metal retainer member within the slot of the compressible split peg adapted to engage the projecting protrusions upon insertion of the peg in the hole of the printed circuit board, whereby the means for limiting the narrowing of the slot comprises the metal retainer member.

8. The method of claim 7 further including the step of:

forming the compressible split peg and metal retainer member so that they are disposed within the plane of the printed circuit board upon insertion of the peg and metal retainer member assembly into the hole in the printed circuit board.

* * * * *